United States Patent
Huang et al.

(10) Patent No.: US 10,304,678 B1
(45) Date of Patent: May 28, 2019

(54) METHOD FOR FABRICATING INGAP EPITAXIAL LAYER BY METAL ORGANIC CHEMICAL VAPOR DEPOSITION (MOCVD)

(71) Applicant: Institute of Nuclear Energy Research, Atomic Energy Council, Executive Yuan, R.O.C, Taoyuan (TW)

(72) Inventors: Wen-Hsiang Huang, Taoyuan (TW); Chih-Hung Wu, Taoyuan (TW); Hwen-Fen Hong, Taoyuan (TW)

(73) Assignee: INSTITUTE OF NUCLEAR ENERGY RESEARCH, ATOMIC ENERGY COUNCIL, EXECUTIVE YUAN, R.O.C, Taoyuan (TW)

( * ) Notice: Subject to any disclaimer, the term of this patent is extended or adjusted under 35 U.S.C. 154(b) by 0 days.

(21) Appl. No.: 15/924,775

(22) Filed: Mar. 19, 2018

(30) Foreign Application Priority Data

Nov. 24, 2017 (TW) .............................. 106141021 A

(51) Int. Cl.
*C30B 25/02* (2006.01)
*H01L 21/02* (2006.01)
(Continued)

(52) U.S. Cl.
CPC ........ *H01L 21/02543* (2013.01); *C30B 25/02* (2013.01); *C30B 25/10* (2013.01);
(Continued)

(58) Field of Classification Search
CPC ......... H01L 21/02461; H01L 21/02543; H01L 21/0251; H01L 31/1844; H01L 21/02392; C30B 25/02; C30B 29/40; C30B 25/183
See application file for complete search history.

(56) References Cited

U.S. PATENT DOCUMENTS

| 6,426,522 B1 * | 7/2002 | Kean ................... H01L 21/2233 257/101 |
| 2005/0205873 A1 * | 9/2005 | Sato ........................ C30B 25/18 257/77 |

(Continued)

FOREIGN PATENT DOCUMENTS

| CN | 105938855 A | * | 9/2016 | ......... H01L 31/0236 |
| JP | 2004241676 A | * | 8/2004 | ........... H01L 21/205 |

OTHER PUBLICATIONS

European Patent Office, English computer translation of CN 105938855 (2018) (Year: 2018).*

(Continued)

*Primary Examiner* — Matthew J Song
(74) *Attorney, Agent, or Firm* — Locke Lord LLP; Tim TingKang Xia, Esq.

(57) ABSTRACT

The present invention provides a method for fabricating an InGaP epitaxial layer by metal organic chemical vapor deposition (MOCVD). The method comprises: placing a silicon substrate in a reaction chamber; arranging the reaction chamber to have a first chamber temperature, and growing a first GaP layer with a first thickness on the Si substrate at the first chamber temperature; arranging the reaction chamber to have a second chamber temperature, and growing a second GaP layer with a second thickness on the first GaP layer at the second chamber temperature; arranging the reaction chamber to have a third chamber temperature for a first time interval, and then arranging the reaction chamber to have a fourth chamber temperature for a second time interval; and growing a multi-layered InGaP layer on the second GaP layer.

12 Claims, 2 Drawing Sheets

(51) Int. Cl.
  *C30B 25/10* (2006.01)
  *C30B 29/44* (2006.01)
  *C30B 29/68* (2006.01)
  *C30B 25/18* (2006.01)
  *C30B 29/40* (2006.01)

(52) U.S. Cl.
  CPC ............ *C30B 25/183* (2013.01); *C30B 29/40* (2013.01); *C30B 29/44* (2013.01); *C30B 29/68* (2013.01); *H01L 21/0251* (2013.01); *H01L 21/0262* (2013.01); *H01L 21/02381* (2013.01); *H01L 21/02392* (2013.01); *H01L 21/02461* (2013.01)

(56) References Cited

U.S. PATENT DOCUMENTS

| | | | | |
|---|---|---|---|---|
| 2007/0158684 A1* | 7/2007 | Kohiro | ............. | H01L 21/02395 257/190 |
| 2007/0243703 A1* | 10/2007 | Pinnington | ......... | H01L 21/0237 438/603 |
| 2010/0187539 A1* | 7/2010 | Lin | .................. | H01L 21/02425 257/75 |

OTHER PUBLICATIONS

European Patent Office, English computer translation of JP 2004241676 (2018) (Year: 2018).*

* cited by examiner

US 10,304,678 B1

METHOD FOR FABRICATING INGAP EPITAXIAL LAYER BY METAL ORGANIC CHEMICAL VAPOR DEPOSITION (MOCVD)

CROSS-REFERENCE TO RELATED APPLICATION

This application also claims priority to Taiwan Patent Application No. 106141021 filed in the Taiwan Patent Office on Nov. 24, 2017, the entire content of which is incorporated herein by reference.

TECHNICAL FIELD

The present invention relates to a method for fabricating an InGaP epitaxial layer, and particularly to a method for fabricating an InGaP epitaxial layer by metal organic chemical vapor deposition (MOCVD).

BACKGROUND

Since the development of technologies for fabricating semiconductor devices based on silicon wafers is sophisticated, how to grow high-quality III-V semiconductor epitaxial layers on silicon wafers or silicon substrates has become an important goal in the development of light-emitting devices or solar devices.

These III-V semiconductor materials are generally epitaxially grown on a silicon wafer, to form so-called epitaxial wafer or epi-wafer.

However, the III-V semiconductor epitaxial layer is different from the silicon wafer in the composition, and the different or mismatched crystal lattice arrangements and thermal expansion coefficients therebetween will lead to the formation of many defects on the epitaxial wafers, such as epitaxial dislocation, anti-phase domain, and cracks, etc. These defects inevitably limit the integration and development of the III-V semiconductor material and silicon wafer technologies.

Although attempts are made in the prior art to solve this problem, limited outcome is achieved. Therefore, there is a need for developing a new epitaxial growth technology, to overcome the above problem.

SUMMARY

To achieve the above object, according to an aspect of the present invention, an embodiment provides a method for fabricating an InGaP epitaxial layer by metal organic chemical vapor deposition (MOCVD). The method comprises: (A) placing a silicon substrate in a reaction chamber; (B) arranging the reaction chamber to have a first chamber temperature, and growing a first GaP layer with a first thickness on the Si substrate at the first chamber temperature; (C) arranging the reaction chamber to have a second chamber temperature, and growing a second GaP layer with a second thickness on the first GaP layer at the second chamber temperature, in which the second chamber temperature is at least 200° C. higher than the first chamber temperature and the second thickness is 80-180 times of the first thickness; (D) arranging the reaction chamber to have a third chamber temperature for a first time interval, and then arranging the reaction chamber to have a fourth chamber temperature for a second time interval, in which the fourth chamber temperature is higher than the second chamber temperature, the third chamber temperature is at least 0.5 time of the fourth chamber temperature, and the second time interval is at least 8 times of the first time interval; and (E) growing a multi-layered InGaP layer on the second GaP layer.

In an embodiment, the first chamber temperature is 420-450° C., and the step (B) comprises introducing a phosphorus-containing gas and a gallium-containing gas to the reaction chamber, where the ratio of the elements phosphorus to gallium is 30-50, and the reaction chamber is arranged to have a pressure of 40-60 mbar.

In an embodiment, the second chamber temperature is 650-680° C., and the step (C) comprises: introducing the phosphorus-containing gas and the gallium-containing gas to the reaction chamber, where the ratio of the elements phosphorus to gallium is 10-30, and the reaction chamber is arranged to have a pressure of 40-60 mbar.

In an embodiment, the step (D) is repeated 2-4 times.

In an embodiment, the third chamber temperature is 390-420° C., the first time interval is 25-35 sec, the fourth chamber temperature is 780-840° C., the second time interval is 5-10 min, and the temperature of the reaction chamber is adjusted from the third chamber temperature to the fourth chamber temperature at a ramping rate of 0.8-1.2° C./sec.

In an embodiment, the step (E) comprises (E1) arranging the reaction chamber to have a fifth chamber temperature, and introducing the phosphorus-containing gas, an indium-containing gas, and the gallium-containing gas to the reaction chamber, where the ratio of the elements phosphorus to indium and gallium is a first ratio, to grow a stepped layer; and (E2) gradually elevating the temperature of the reaction chamber from the fifth chamber temperature to a sixth chamber temperature, and at the same time, gradually reducing the ratio of the elements phosphorus to indium and gallium in the introduced gases from the first ratio to a second ratio, to grow a linear layer.

In an embodiment, the steps (E1) and (E2) are repeated 4-6 times, to form an InGaP layer having a plurality of stepped layers and a plurality of linear layers stacked alternately, where a preceding sixth chamber temperature is used as a following fifth chamber temperature, and a preceding second ratio is used as a following first ratio.

In an embodiment, the fifth chamber temperature is 610-640° C., the first ratio is 64-68, and the pressure in the reaction chamber is 50 mbar.

LIST OF NUMERALS

Figure 1:
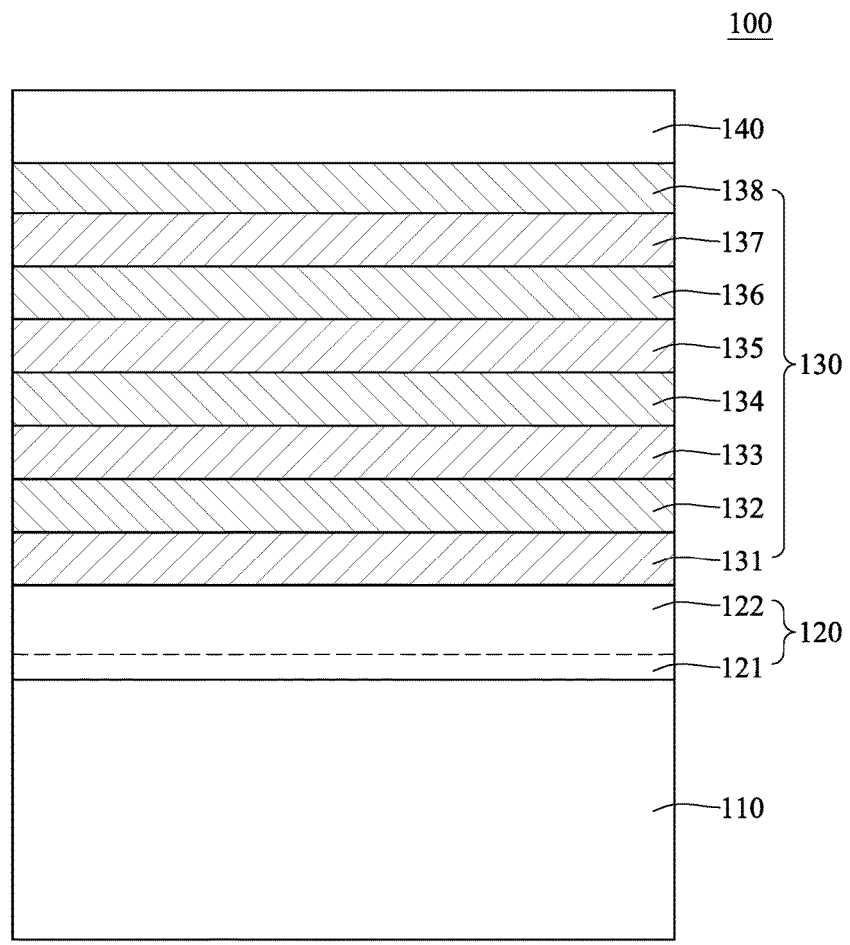
FIG. 1 is a schematic structural view of an epitaxial wafer according to an embodiment of the present invention.

100 Epitaxial wafer
110 Silicon substrate
120 GaP layer
121 First GaP layer
122 Second GaP layer
130 InGaP layer
131, 133, 135, 137 Stepped layer
132, 134, 136, 138 Linear layer
140 Buffer layer
Steps 210, 220, 230, 240, 250
Steps 251, 252, 253, 254, 255, 256, 257, 258

DETAILED DESCRIPTION OF DISCLOSED EMBODIMENTS

For further understanding of the features, objects and functions of the present invention, the embodiments of the present invention are described in detail below in conjunction with the drawings.

Throughout the description and the drawings, the same numerals are used to designate the same or similar elements.

In the description of various embodiments, when an element is described as being "above/over" or "below/under" another element, it means the situation in which the element is directly or indirectly above or below the other element, where other elements disposed therebetween may be included. The so-called "directly" means that no other intervening element is disposed therebetween.

Descriptions such as "above/over" or "below/under" are based on the drawings; however, other possible changes in direction may also be included.

The so-called "first", "second" and "third" are used to describe different elements, which are not limited by such words.

For convenience and clarity of illustration, the thickness or size of each element in the drawings is indicated in an exaggerated, omitted or schematic manner, and the dimensions of each element are not exactly their actual dimensions.

FIG. 1 is a schematic structural view of an epitaxial wafer 100 according to an embodiment of the present invention. The epitaxial wafer 100 includes a silicon (Si) substrate 110, a GaP layer 120, an InGaP layer 130, and a buffer layer 140.

The silicon substrate 110 is a support of the epitaxial wafer 100 that supports the progression of the fabrication process of the epitaxial wafer 100.

The InGaP layer 130 is an epitaxial layer of the epitaxial wafer 100 where epitaxial growth mainly occurs. Due to the differences in the lattice arrangements and the thermal expansion coefficients between silicon and InGaP, many defects will be caused to be formed on the epitaxial wafers, such as dislocation, anti-phase domain, and cracks, etc. Therefore, the GaP layer 120 is formed as a buffer between the silicon substrate 110 and the InGaP layer 130.

In this embodiment, the GaP layer 120 is grown in two stages, and includes a first GaP layer 121 grown at a low temperature and a second GaP layer 122 grown at a high temperature, such that the lattice mismatch between the GaP layer 120 fabricated in this embodiment and the silicon substrate 110 is merely about 0.36% at normal temperature.

The buffer layer 140 also has a composition of InGaP, is about 1-2 μm in thickness, and is a flat buffer layer located at the outmost surface layer of the epitaxial wafer 100, such that the epitaxial wafer 100 can be used as a template for subsequent film growth, which is thus also referred to as "virtual substrate", and can be applicable to the fabrication of solar cell elements.

In the present invention, a method for fabricating the epitaxial wafer 100 according to the above embodiment is proposed mainly based on metal organic chemical vapor deposition (MOCVD).

Figure 2:
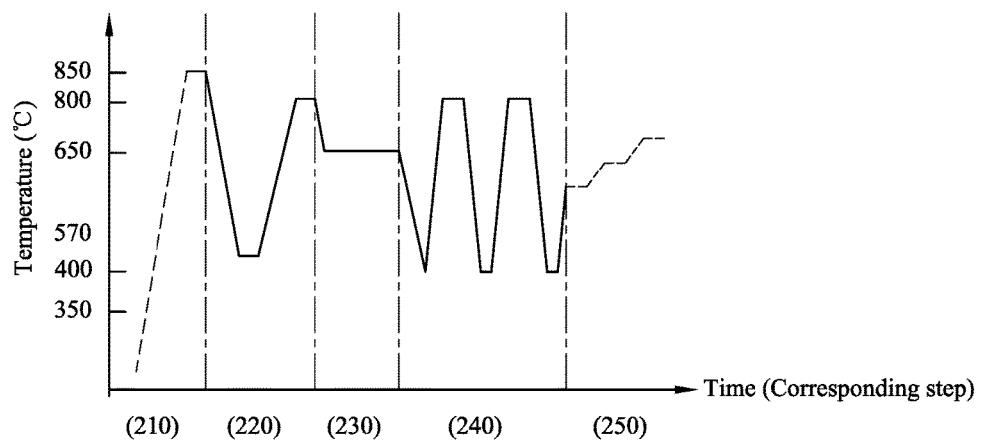
FIG. 2 is a schematic view showing a growth-temperature curve of an epitaxial wafer according to an embodiment of the present invention.

Since the process temperature is one of the most critical factors for the growth of each epitaxial layer, the growth temperature curve of the GaP layer 120, the InGaP layer 130 and the buffer layer 140 is schematically shown in FIG. 2.

First, in a step 210, a cleaned silicon substrate 110 is placed in a reaction chamber of a horizontal metal-organic chemical vapor deposition system.

Hydrogen($H_2$) is introduced into the reaction chamber, and when the pressure in the reaction chamber is elevated to 50 mbar, the temperature of the reaction chamber is raised to 350° C.

When the temperature of the reaction chamber reaches 350° C., hydrogen arsenide ($AsH_3$) gas is introduced into the reaction chamber, such that a pre-nucleation effect occurs on the surface of the silicon substrate 110, thereby creating an As-terminated single domain on the surface.

Then, the temperature of the reaction chamber is raised to 850° C., the pressure in the reaction chamber is elevated to 200 mbar at the same time, and baking is continued for 15 min in the presence of a mixed gas of hydrogen ($H_2$) and hydrogen arsenide ($AsH_3$), to remove the native oxide on the surface of the silicon substrate 110.

Then, in a step 220, the temperature of the reaction chamber is reduced to a first chamber temperature, at which a phosphorous(P)-containing gas and a gallium (Ga)-containing gas are introduced into the reaction chamber, in which the ratio of the elements phosphorous to gallium is 30-50; and the reaction chamber is arranged to have a pressure of 40-60 mbar, to grow a first GaP layer 121 with a thickness of about 15-25 nm on the silicon substrate 110, which serves as a nucleation layer for growing GaP and assumes a two-dimensional island-like morphology.

Preferably, the chamber temperature in this step is 420-450° C., the chamber pressure is 50 mbar, and the ratio of the elements phosphorous to gallium in the introduced gases is 40.

After the first GaP layer 121 is grown, the temperature of the reaction chamber is raised to 800-850° C. for 5-10 min, to re-crystallize the first GaP layer 121.

Then, in a step 230, the temperature of the reaction chamber is reduced to a second chamber temperature, at which the phosphorous-containing gasand the gallium-containing gas are introduced again into the reaction chamber, in which the ratio of the elements phosphorous to gallium is 10-30, and the reaction chamber is arranged to have a pressure of 40-60 mbar, to grow a second GaP layer 122 with a thickness of about 2000-2500 nm on the first GaP layer 121, which serves as a buffer layer for growing InGaP. The first GaP layer 121 and the second GaP layer 122 form the GaP layer 120 as shown in FIG. 1. The second chamber temperature is at least 200° C. higher than the first chamber temperature, and the thickness of the second GaP layer 122 is 80-180 times of the thickness of the first GaP layer 121.

Preferably, the chamber temperature in this step is 650-680° C., the chamber pressure is 50 mbar, and the ratio of the elements phosphorous to gallium in the introduced gases is 50.

To suppress the thermal stress caused by the difference in the thermal expansion coefficients between the GaP layer 120 and the silicon substrate 110 such that the GaP crystal is rearranged to achieve a good quality and alleviate the cracks produced on the film upon cooling, thermal cycle annealing is performed in a following step 240.

First, the temperature of the reaction chamber is reduced to a third chamber temperature (e.g. 390-420° C.) for a first time interval (e.g. 25-35 sec); and then the temperature of the reaction chamber is raised to a fourth chamber temperature (e.g. 780-840° C.) for a second time interval (e.g. 5-10 min). The fourth chamber temperature is higher than the second chamber temperature, the third chamber temperature is at least 0.5 time of the fourth chamber temperature, the second time interval is at least 8 times of the first time interval, and the temperature of the reaction chamber is raised from the third chamber temperature to the fourth chamber temperature at a ramping rate of 0.8-1.2° C./sec.

Preferably, in this step, the temperature of the reaction chamber is initially reduced to 400° C.-420° C. for about 30 sec, and then the temperature of the reaction chamber is raised to 800° C. at a temperature ramping rate of about 1° C./sec and the pressure is elevated to 200 mbar at a pressuring ramping rate of about 15-20 mbar/min for about 5 min.

Annealing is mainly performed in this step, and can be repeated 2-4 times, which is accordingly referred to as thermal cycle annealing and by which the film quality of the InGaP layer can be effectively improved.

A step 250 is followed in which an InGaP layer 130 is grown on the GaP layer 120. In this embodiment, an epitaxial technology for growing InGaP having stepped layers 131, 133, 135, and 137 and linear layers 132, 134, 136, and 138 stacked alternately is employed, which is described as follows.

First, the reaction chamber is arranged to have a fifth chamber temperature, and the phosphorus-containing gas, an indium-containing gas, and the gallium-containing gas are introduced into the reaction chamber, where the ratio of the elements phosphorus to indium and gallium is a first ratio, to grow a stepped layer. Then, the temperature of the reaction chamber is gradually elevated from the fifth chamber temperature to a sixth chamber temperature, and at the same time, the ratio of the elements phosphorus to indium and gallium in the introduced gases is gradually reduced from the first ratio to a second ratio, to grow a linear layer.

That is, the stepped layer is an InGaP layer grown at fixed chamber temperature and V/III ratio, and the linear layer is an InGaP layer grown over linear gradients of chamber temperature and V/III ratio (the ratio of the elements phosphorous to gallium and indium in the introduced gases).

The steps are repeated 4-6 times, to form the InGaP layer 130 having a plurality of stepped layers and a plurality of linear layers stacked alternately, where a preceding sixth chamber temperature is used as a following fifth chamber temperature, and a preceding second ratio is used as a following first ratio.

Figure 3:
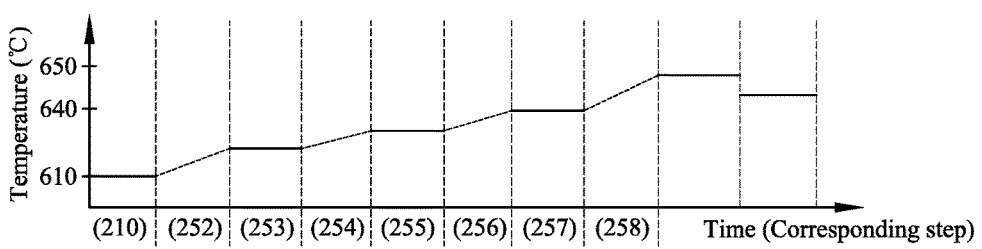
FIG. 3 is a schematic view showing a growth-temperature curve of an InGaP layer according to an embodiment of the present invention.

Taking the InGaP layer 130 in FIG. 1 as an example, the fifth chamber temperature is set to 610-640° C., the first ratio is set to 64-68, and the pressure in the reaction chamber is set to 50 mbar. The growth temperature curve in each step is schematically shown FIG. 3.

First, in a step 251, the chamber is arranged to have a temperature of 610° C., the V/III ratio in the introduced gases is 66.4, and after 200 sec of reaction, an InGaP layer is grown that is the stepped layer 131.

Then, in a step 252, the temperature of the reaction chamber is gradually raised from 610° C. to 620° C., the V/III ratio in the introduced gases is gradually reduced from 66.4 to 65.8 at the same time, and after 30 sec of reaction, an InGaP layer is grown that is the linear layer 132.

Then, in a step 253, the chamber is arranged to have a temperature of 620° C., the V/III ratio in the introduced gases is 65.8, and after 205 sec of reaction, an InGaP layer is grown that is the stepped layer 133.

Then, in a step 254, the temperature of the reaction chamber is gradually raised from 620° C. to 630° C., the V/III ratio in the introduced gases is gradually reduced from 65.8 to 65.5 at the same time, and after 30 sec of reaction, an InGaP layer is grown that is the linear layer 134.

Then, in a step 255, the chamber is arranged to have a temperature of 630° C., the V/III ratio in the introduced gases is 65.5, and after 200 sec of reaction, an InGaP layer is grown that is the stepped layer 135.

Then, in a step 256, the temperature of the reaction chamber is gradually raised from 630° C. to 640° C., the V/III ratio in the introduced gases is gradually reduced from 65.5 to 65.3 at the same time, and after 30 sec of reaction, an InGaP layer is grown that is the linear layer 136.

Then, in a step 257, the chamber is arranged to have a temperature of 640° C., the V/III ratio in the introduced gases is 65.3, and after 205 sec of reaction, an InGaP layer is grown that is the stepped layer 137.

Then, in a step 258, the temperature of the reaction chamber is gradually raised from 640° C. to 650° C., the V/III ratio in the introduced gases is gradually reduced from 65.3 to 65.1 at the same time, and after 30 sec of reaction, an InGaP layer is grown that is the linear layer 138.

The growth temperature and heating process of the linear layers 132, 134, 136, and 138 can be appropriately adjusted depending on the ratio of the element indium in the composition, such that the stress between layers reaches an optimum configuration.

Finally, the buffer layer 140 of about 1-2 µm in thickness for InGaP can be grown at a growth temperature of about 640° C. and a growth rate of about 2.2 µm/hr, which is a flat buffer layer located at the outmost surface layer of the epitaxial wafer 100, such that the epitaxial wafer 100 can be used as a template for subsequent film growth, which is thus also referred to as "virtual substrate", and can be applicable to the fabrication of solar cell elements.

Preferred embodiments of the present invention have been described above; however, the scope of the present invention is not limited thereto.

Equivalent variations and modifications made without departing from the spirit and scope of the present invention shall be regarded as the further implementation of the present invention, and are covered in the scope of the present invention as defined by appended claims.

What is claimed is:

1. A method for fabricating an InGaP epitaxial layer by metal organic chemical vapor deposition (MOCVD), comprising the steps of:

(A) placing a silicon substrate in a reaction chamber;

(B) arranging the reaction chamber to have a first chamber temperature, and growing a first GaP layer with a first thickness on the Si substrate at the first chamber temperature;

(C) arranging the reaction chamber to have a second chamber temperature, and growing a second GaP layer with a second thickness on the first GaP layer at the second chamber temperature, where the second chamber temperature is at least 200° C. higher than the first chamber temperature and the second thickness is 80-180 times of the first thickness;

(D) arranging the reaction chamber to have a third chamber temperature for a first time interval, and then arranging the reaction chamber to have a fourth chamber temperature for a second time interval, in which the fourth chamber temperature is higher than the second chamber temperature, the third chamber temperature is at least 0.5 time of the fourth chamber temperature, and the second time interval is at least 8 times of the first time interval; and (E) growing a multi-layered InGaP layer on the second GaP layer, wherein the third chamber temperature is 390-420° C., the first time interval is 25-35 sec, the fourth chamber temperature is 780-840° C., the second time interval is 5-10 min, and the temperature of the reaction chamber is adjusted from the third chamber temperature to the fourth chamber temperature at a ramping rate of 0.8-1.2° C./sec.

2. The method for fabricating an InGaP epitaxial layer by MOCVD according to claim 1, wherein the first chamber temperature is 420-450° C., and the step (B) comprises:
introducing a phosphorus (P)-containing gas and a gallium (Ga)-containing gas to the reaction chamber, wherein the ratio of the elements phosphorus to gallium is 10-30, and the reaction chamber is arranged to have a pressure of 40-60 mbar.

3. The method for fabricating an InGaP epitaxial layer by MOCVD according to claim 1, wherein the second chamber temperature is 650-680° C., and the step (C) comprises:
introducing the phosphorus-containing gas and the gallium-containing gas to the reaction chamber, wherein the ratio of the elements phosphorus to gallium is 30-50, and the reaction chamber is arranged to have a pressure of 40-60 mbar.

4. The method for fabricating an InGaP epitaxial layer by MOCVD according to claim 1, wherein the step (D) is repeated 2-4 times.

5. The method for fabricating an InGaP epitaxial layer by MOCVD according to claim 1, wherein the step (E) comprises:
(E1) arranging the reaction chamber to have a fifth chamber temperature, and introducing the phosphorus-containing gas, an indium-containing gas, and the gallium-containing gas to the reaction chamber, wherein the ratio of the elements phosphorus to indium and gallium is a first ratio, to grow a stepped layer; and
(E2) gradually elevating the temperature of the reaction chamber from the fifth chamber temperature to a sixth chamber temperature, and at the same time, gradually reducing the ratio of the elements phosphorus to indium and gallium in the introduced gases from the first ratio to a second ratio, to grow a linear layer.

6. The method for fabricating an InGaP epitaxial layer by MOCVD according to claim 5, wherein the fifth chamber temperature is 610-640° C.

7. The method for fabricating an InGaP epitaxial layer by MOCVD according to claim 5, wherein the first ratio is 64-68.

8. The method for fabricating an InGaP epitaxial layer by MOCVD according to claim 5, wherein in the step (E), the pressure in the reaction chamber is 50 mbar.

9. The method for fabricating an InGaP epitaxial layer by MOCVD according to claim 5, wherein the steps (E1) and (E2) are repeated 4-6 times, to form an InGaP layer having a plurality of stepped layers and a plurality of linear layers stacked alternately, wherein a preceding sixth chamber temperature is used as a following fifth chamber temperature, and a preceding second ratio is used as a following first ratio.

10. The method for fabricating an InGaP epitaxial layer by MOCVD according to claim 9, wherein the fifth chamber temperature is 610-640° C.

11. The method for fabricating an InGaP epitaxial layer by MOCVD according to claim 9, wherein the first ratio is 64-68.

12. The method for fabricating an InGaP epitaxial layer by MOCVD according to claim 9, wherein in the step (E), the pressure in the reaction chamber is 50 mbar.

* * * * *